United States Patent
Otsuki et al.

(10) Patent No.: US 7,221,567 B2
(45) Date of Patent: May 22, 2007

(54) HEAT SINK FAN

(75) Inventors: Takaya Otsuki, Kyoto (JP); Masahiro Ishikawa, Kyoto (JP)

(73) Assignee: Nidec Corporation, Kyoto (JP)

( * ) Notice: Subject to any disclaimer, the term of this patent is extended or adjusted under 35 U.S.C. 154(b) by 101 days.

(21) Appl. No.: 10/907,681

(22) Filed: Apr. 12, 2005

(65) Prior Publication Data
US 2005/0225939 A1 Oct. 13, 2005

(30) Foreign Application Priority Data
Apr. 12, 2004 (JP) .............................. 2004-117383

(51) Int. Cl.
*H05K 7/20* (2006.01)
(52) U.S. Cl. ...................... 361/695; 361/697; 361/704; 165/80.3; 165/121; 165/126; 257/719; 257/722; 417/423.7
(58) Field of Classification Search ................ 361/695, 361/697, 709, 710, 704; 165/80.3, 121, 126, 165/185; 257/719, 722; 310/71, 91; 417/423.7
See application file for complete search history.

(56) References Cited

U.S. PATENT DOCUMENTS 6,419,007 B1 * 7/2002 Ogawara et al. .......... 165/80.3
6,557,626 B1 * 5/2003 O'Sullivan et al. ......... 165/121
6,639,797 B2 10/2003 Saeki et al.
6,879,487 B2 * 4/2005 Simon et al. ................ 361/697
7,123,483 B2 * 10/2006 Otsuki et al. ................ 361/710
2003/0024688 A1 * 2/2003 Dowdy et al. ............. 165/80.3
2003/0099561 A1 5/2003 Heydt et al.
2004/0136160 A1 7/2004 Lee et al.
2005/0253467 A1 * 11/2005 Watanabe et al. ............. 310/71

FOREIGN PATENT DOCUMENTS

JP  2002-280780 A  9/2002

* cited by examiner

*Primary Examiner*—Michael Datskovskiy
(74) *Attorney, Agent, or Firm*—Judge & Murakami IP

(57) ABSTRACT

A heat sink fan of the present invention includes a heat sink and an axial flow fan, and the axial flow fan includes a motor, an impeller and a housing. An outer wall surface of a cylindrical portion of the housing is formed with an arm which engages with the heat sink and fixes the housing and the heat sink. The arm is provided with a lead wire retaining hook. A interspace is formed between the lead wire retaining hook and the arm, and the lead wire is detachably held in the interspace. The packing or transportation operation is enhanced, and convenience of mounting operation of the lead wire to electronic equipment is enhanced.

12 Claims, 13 Drawing Sheets

HEAT SINK FAN

BACKGROUND OF THE INVENTION

1. Field of the Invention

The present invention relates to a heat sink fan which cools an electronic component such as MPUs.

2. Description of the Related Art

MPUs (microprocessing unit) are incorporated in an electronic calculator and high performance electronic equipment. In recent years, as the MPU is increased in speed and reduced in size, heat generated from the MPU itself becomes serious problem. Therefore, a heat sink fan comprising a combination of a heat sink having a plurality of heat radiating fins and an axial flow fan for supplying air to the heat sink is incorporated in the electronic equipment such as the MPU which generates heat.

The heat sink is positively cooled by cooling air supplied by the axial flow fan.

The MPU is contained on a circuit substrate of the electronic equipment, and a power supply terminal which functions as a power supply of the heat sink fan is also provided on the circuit substrate of the electronic equipment. The heat sink fan is provided with a connection terminal and a lead wire to be connected to the power supply terminal. A base end of the lead wire is soldered to a drive circuit of the axial flow fan, and a tip end of the lead wire is connected to the power supply terminal.

Various electronic components are densely disposed in the vicinity of the MPU in which the heat sink is placed. To prevent a lead wire from coming into contact with such electronic components and from being cut, it is preferable that the length of the lead wire is set to the shortest length from a drive circuit of the axial flow fan to a power supply terminal.

However, the power supply terminal is not always disposed in the vicinity of the MPU, and the distance and the layout relation between the MPU and an external power supply are different depending upon the kinds of the electronic equipment on which the MPU is to be mounted in some cases. This problem can be solved by changing the length of the lead wire depending upon the corresponding kind, but if the same kinds of axial flow fans having different lead wire lengths as those of the electronic equipment are prepared, there is an adverse possibility that operators working at the producing worksite may confuse, and the productivity may be deteriorated. Further, if commonality of the lead wire lengths can not be achieved, costs of production facilities and costs of acquisition of parts are increased. Therefore, it is necessary that the lengths of the lead wires correspond to a kind in which a distance between the MPU and the external power supply is the longest.

In the case of electronic equipment having excessively long lead wire, the lead wire may be damaged or cut as described above. Further, at the time of packing operation, transportation and assembling operation, the lead wire may be caught on an impeller or housing made of resin, and such members made of resin may be damaged.

Thereupon, it is conceived that the heat sink is provided with a fan holder to which a fan is assembled, a surface of an outer periphery of the fan holder is provided with one or more grooves for partially restraining the lead wire, and the lead wire is accommodated in the groove. According to this structure, however, another member, i.e., the fan holder is required in addition to the axial flow fan and the heat sink, and it is troublesome to pass the lead wire through the groove, and this deteriorates the productivity.

BRIEF SUMMARY OF INVENTION

It is an object of the present invention to enhance the operability of the packing operation and the transportation, and to enhance the convenience when the lead wire is mounted on the electronic equipment by holding the lead wire in the housing such that the lead wire does not interfere with other electronic components.

To achieve the object, the heat sink fan of the present invention includes a heat sink having a plurality of heat radiating fins, and an axial flow fan for supplying cooling air to the heat sink.

The axial flow fan includes an impeller having a plurality of blades arranged in the circumferential direction, a motor for rotating the impeller, and a housing supporting the motor. The motor includes a drive unit for rotating the impeller, and a lead wire for supplying current to the drive unit. The housing includes a cylindrical portion. A portion of the impeller is accommodated in the cylindrical portion. The cylindrical portion is provided at its both ends with openings in the rotation axial direction of the impeller. The outer wall surface of the cylindrical portion is provided with the lead wire retaining hook which is opposed to the outer wall surface of the cylindrical portion. The retaining hook can hold the lead wire between the retaining hook and the outer wall surface.

To achieve the above object, the heat sink fan of the invention supplies air to the heat sink by the axial flow fan. The axial flow fan includes the impeller, the motor for rotating the impeller, and the housing for supporting the motor. The housing includes the cylindrical portion disposed on the outer periphery of the impeller. The lead wire retaining hook for holding the lead wire projects from the outer wall surface of the cylindrical portion. The lead wire retaining hook mounted on the outer wall surface of the cylindrical portion is opposed to the outer wall surface. The lead wire of the motor is inserted between the outer wall surface and the line or surface. With this, free movement of the lead wire is limited.

With this configuration, it is possible to prevent entanglement of the lead wire, and prevent the lead wire from interfering with other electronic component and from being cut. It is possible to prevent a case in which the lead wire is caught on a resin product and the product is cracked. It is also possible to prevent a case in which an operator is caught on a projected lead wire to strongly pull the lead wire, and contact between the lead wire and a circuit substrate of the motor is deteriorated. Since it becomes easy to handle the lead wire, it is possible to prevent the packing operation or transportation from being complicated. The lead wire retaining hook is mounted on the cylindrical portion, and the lead wire retaining hook can be formed integrally on the cylindrical portion. Thus, the lead wire retaining hook can be produced without increasing the producing cost almost at all.

There and other objects, features and advantages of the present invention will become more apparent upon reading of the following detailed description along with the accompanied drawings.

DETAILED DESCRIPTION OF INVENTION

Best modes for carrying out the invention will be explained with reference to the drawings. In the following explanation, explanation concerning vertical, longitudinal and lateral directions, and positional relation only show positional relation on the drawings unless otherwise specified, and the actually used positional relation and directions are not limited to the explanations.

First Embodiment

Figure 1:
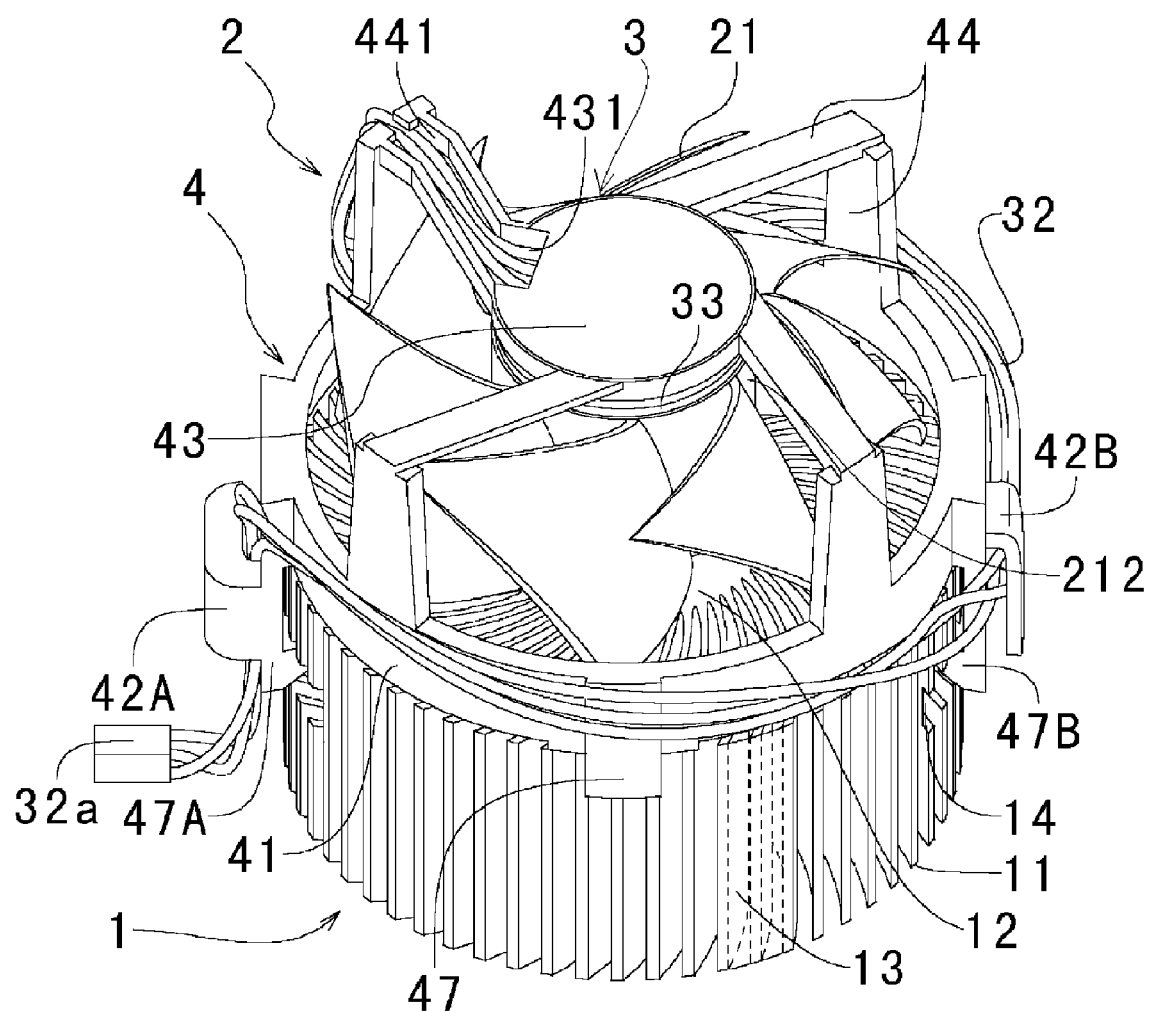
FIG. 1 is a perspective view showing a first embodiment of the present invention.

FIG. 1 is a perspective view showing a heat sink fan of a first embodiment of the invention.

(1-1) Constituent Elements

A heat sink fan of the embodiment comprises a heat sink 1 and an axial flow fan 2. The heat sink 1 has plate-like metal heat radiating fins 11 radially extending from a center of the heat sink 1. The axial flow fan 2 includes an impeller 21 having a plurality of blades 211 disposed on an outer peripheral surface of a cylindrical member 212 at equal distances from one another. The axial flow fan 2 also includes a drive unit 31 of a motor 3 which rotates the impeller 21, lead wires 32 for supplying current to the drive unit 31, and a housing 4 located on an outer periphery of the impeller 21 and having a cylindrical portion 41.

(1-2) Heat Sink

The radiating fin 11 radially extending from the heat sink 1 is enveloped along a cylindrical envelope surface 13, and the radiating fin 11 is shaped into a cylindrical shape as a whole. A portion of the envelope surface is provided with recesses 14. Two recesses 14 are provided at opposed positions on either side of a center line of the cylindrical heat sink 1.

(1-3) Axial Flow Fan

The axial flow fan 2 is disposed such as to cover an upper end surface 12 of the heat sink 1. The impeller 21 and the cylindrical heat sink 1 are disposed such that a rotation center of the impeller 21 and a center line of the heat sink 1 are located substantially on the same line. The cylindrical portion 41 of the housing 4 is of cylindrical shape along an outer edge of the upper end surface 12 of the heat sink 1. An outer periphery of the impeller 21 has a smaller diameter than that of an inner peripheral surface of the cylindrical portion 41. The housing 4 is formed with a motor holder 43 at a position higher than an upper end of the cylindrical portion 41. A motor 3 is mounted on the motor holder 43. Ribs 44 stand from the cylindrical portion 41. The ribs 44 support the motor holder 43 above the cylindrical portion 41.

The cylindrical portion 41 is provided with arms 47 at locations corresponding to the recesses 14 of the heat sink 1. A grappling salient 471 is formed in the vicinity of a tip end of each of the arms 47. If the grappling salient 471 is engaged with the recess 14, the housing 4 is positioned to the heat sink 1 and is fixed.

(1-4) Motor

The motor 3 rotates the impeller 21 of the axial flow fan 2 relative to the housing 4. The motor 3 includes a field magnet 34 (not shown) provided on an inner peripheral surface of a cylindrical member 212 of the impeller 21, and a stator 35 (not shown) disposed opposed to the field magnet 34 in a radial direction. The stator 35 includes a plurality of coils 36 (not shown). The motor 3 also includes a circuit substrate 33 containing a drive circuit 331 (not shown) which controls energization to the coils 36. The field magnet 34, the stator 35 and the circuit substrate 33 constitute the drive unit 31 of the motor 3.

The drive circuit 331 of the motor and a power supply terminal 51 of electronic equipment 5 which supplies current to the drive unit 31 of the motor 3 are connected to each other through the lead wires 32. The lead wire 32 comprises a conductive metal wire covered with flexible resin. At least one lead wire 32 is connected to a positive electrode for supplying electricity, at least one lead wire 32 is connected to a negative electrode, and one or more lead wires 32 are used for inputting and outputting signals such as the number of revolutions of the impeller, the temperature and the like. Therefore, two to ten lead wires are used as one set for one motor 3 in accordance with specification of the kind. A base end of the lead wire 32 is connected to the circuit substrate 33 containing the drive circuit 331 of the motor 3, and a tip end of the lead wire 32 is connected to the power supply terminal 51 of the electronic equipment 5 on which the heat sink fan is mounted.

Stable soldering is used for connecting the circuit substrate 33 and the lead wires 32. The lead wire and the circuit substrate of the electronic equipment are provided at a tip end of the lead wire 32 with a connection terminal 321 which is a male connector, and if the connection terminal 321 is inserted into the power supply terminal 51 which is a female connector of the electronic equipment 5, it is connected. The connection terminal 321 and the power supply terminal 51 can be attached to and detached from each other. This is convenient because no special device is required for connecting them. The connection terminal 321 and the power supply terminal 51 may be soldered to each other if necessary to prevent loss caused by contact resistance and to secure safety for a long term.

(1-5) Retaining of Lead Wire

The motor holder 43 of the housing 4 is provided with a lead wire-pulling out hole 431 so that the lead wires 32 can be pulled out from the motor 3. The lead wires 32 are pulled out toward the outer periphery of the housing 4 through the lead wire-pulling out hole 431 and through a guide groove 441 provided in one of the ribs 44 which support the motor holder 43.

An outer wall surface of the cylindrical portion 41 of the housing 4 is provided with two arms 47A and 47B. The arms 47A and 47B are separated from each other through 180° in a circumferential direction of the cylindrical portion 41.

A substantially L-shaped lead wire retaining hook 42A projects from the one of the arms 47A. One end of the lead wire retaining hook 42A extending along its circumferential direction is integrally fixed to the arm 47A, and the other end of the lead wire retaining hook 42A is opened to form an opening 46A. A substantially L-shaped lead wire retaining hook 42B projects from the other arm 47A, and an upper end of the lead wire retaining hook 42B is integrally fixed to the arm 47B, and a lower end of the lead wire retaining hook 42B is opened to form an opening 46B. Slit-like interspaces 45 are formed between the respective arms 47 and the lead wire retaining hooks 42. The interspace 45 is formed at its one end with an opening 46. The width of the interspace 45 is narrower than the minimum width of the connection terminal 321 of the lead wire 32. With this configuration, it is possible to prevent the lead wire 32 from naturally coming off from the lead wire retaining hook 42.

If the lead wire 32 is inserted into the interspace 45 from the opening 46 of the interspace 45, the lead wire 32 can be held. When the lead wire 32 is to be detached, the lead wire 32 can be brought out from the interspace 45 via the opening 46. Since the lead wire 32 can be attached and detached easily, a burden of an operator at the time of mass production is reduced, and the operability can be enhanced. Further, a user does not erroneously carry out the attaching and detaching method, and the user can reliably attach and detach the lead wire 32.

Figure 2:
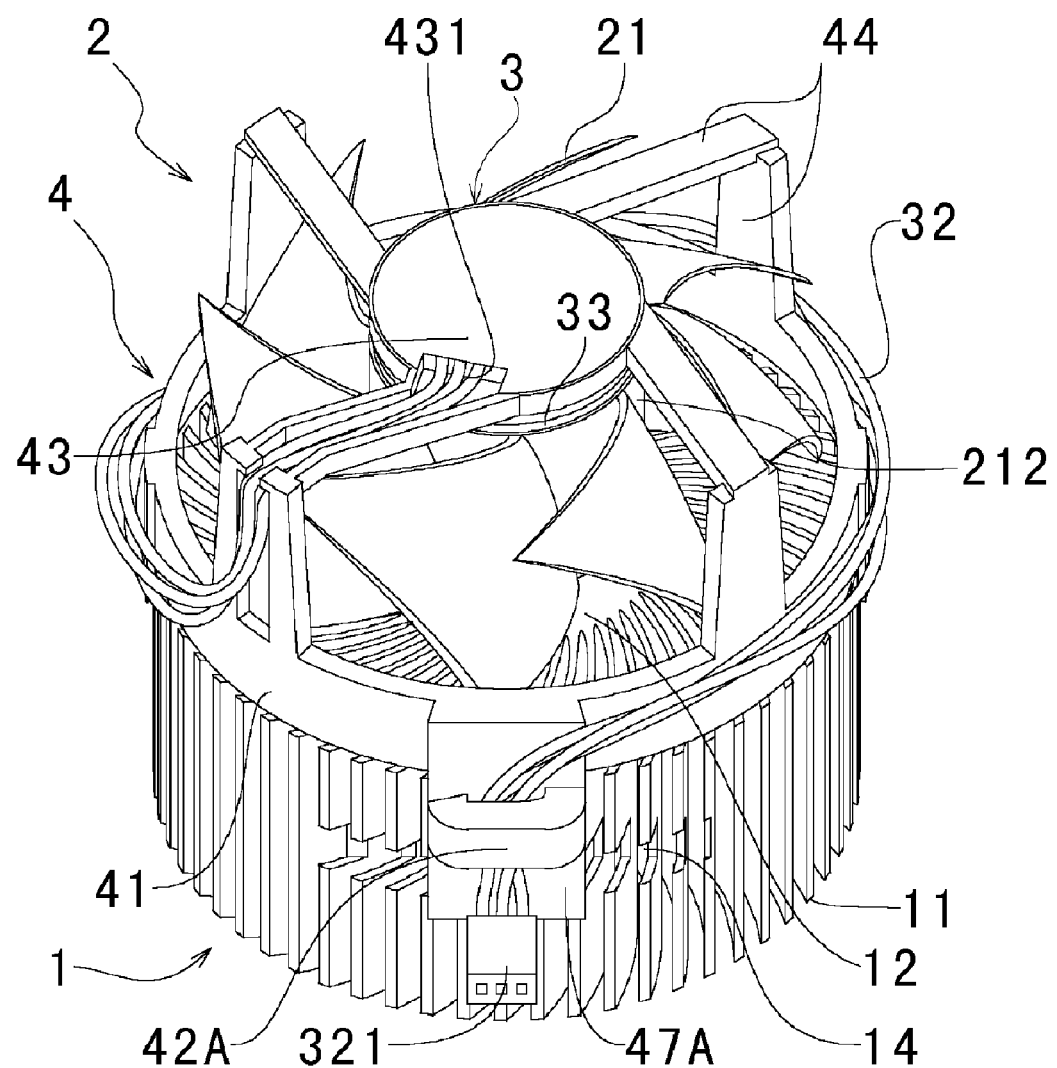
FIG. 2 is a perspective view of the first embodiment of the invention as viewed from different angle.
Figure 3:
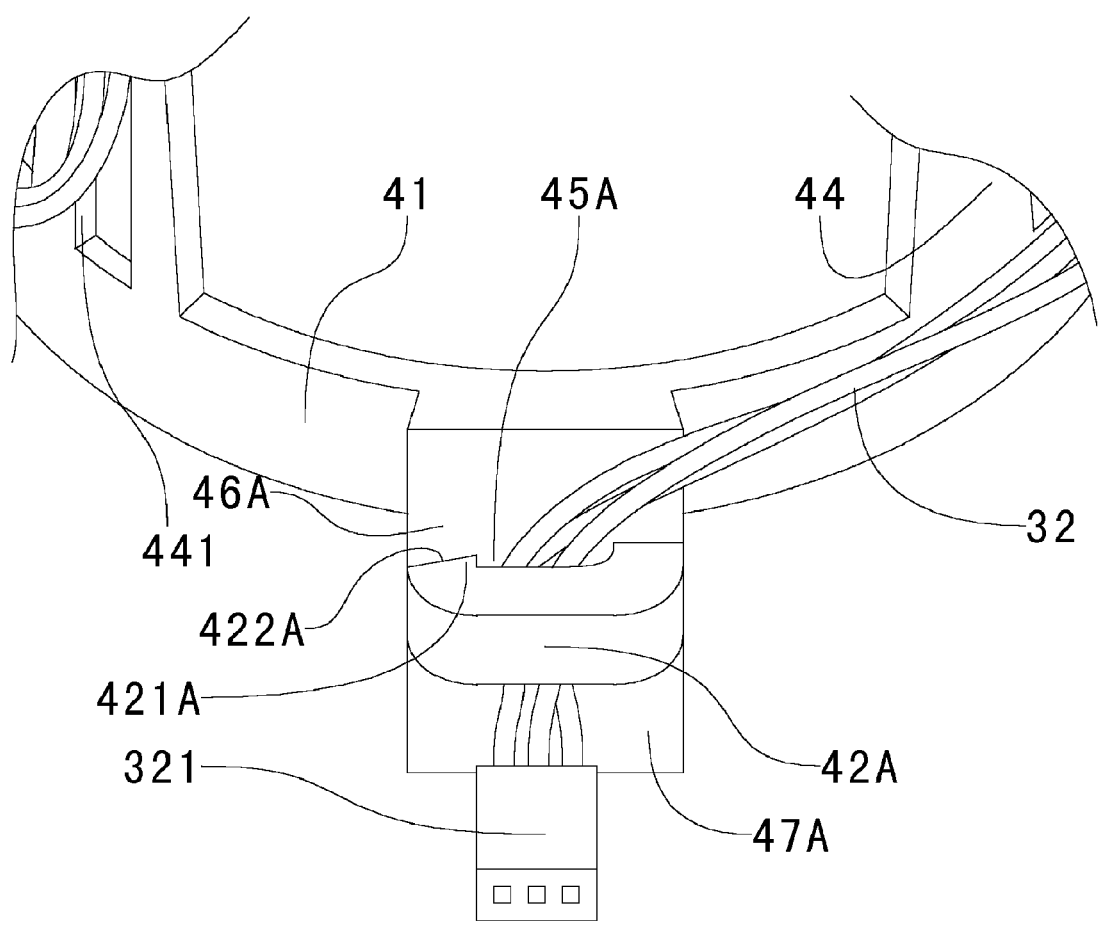
FIG. 3 is a perspective view showing an essential portion of the first embodiment of the invention.

FIG. 2 is a perspective view of the heat sink fan shown in FIG. 1 as viewed from the arm 47A. FIG. 3 is an enlarged view of its essential portion. The lead wire retaining hook 42A projecting from the arm 47A is formed with a projection 421A in the interspace 45A. The projection 421A projects toward the arm 47A. A distance of the interspace 45A is partially reduced by the projection 421A. With this, it is possible to prevent the lead wire 32 held in the interspace 45A from naturally coming off.

The lead wire retaining hook 42A forms the opening 46A of the interspace 45A. An end of the lead wire retaining hook 42A is formed with a tapered portion 422A whose interspace distance is increased toward an end which is opened from inside of the interspace 45A. Since the tapered portion 422A is provided, it becomes easy to insert the lead wire 32 into the interspace 45, and the operability can be enhanced.

The lead wire retaining hook 42A is made of resin that is a material having elasticity. Even if the distance between the projection 421A and the arm 47A is smaller than the thickness of the lead wire 32, the lead wire retaining hook 42A is elastically deformed, and the lead wire 32 can easily be held in the interspace 45A.

Figure 4:
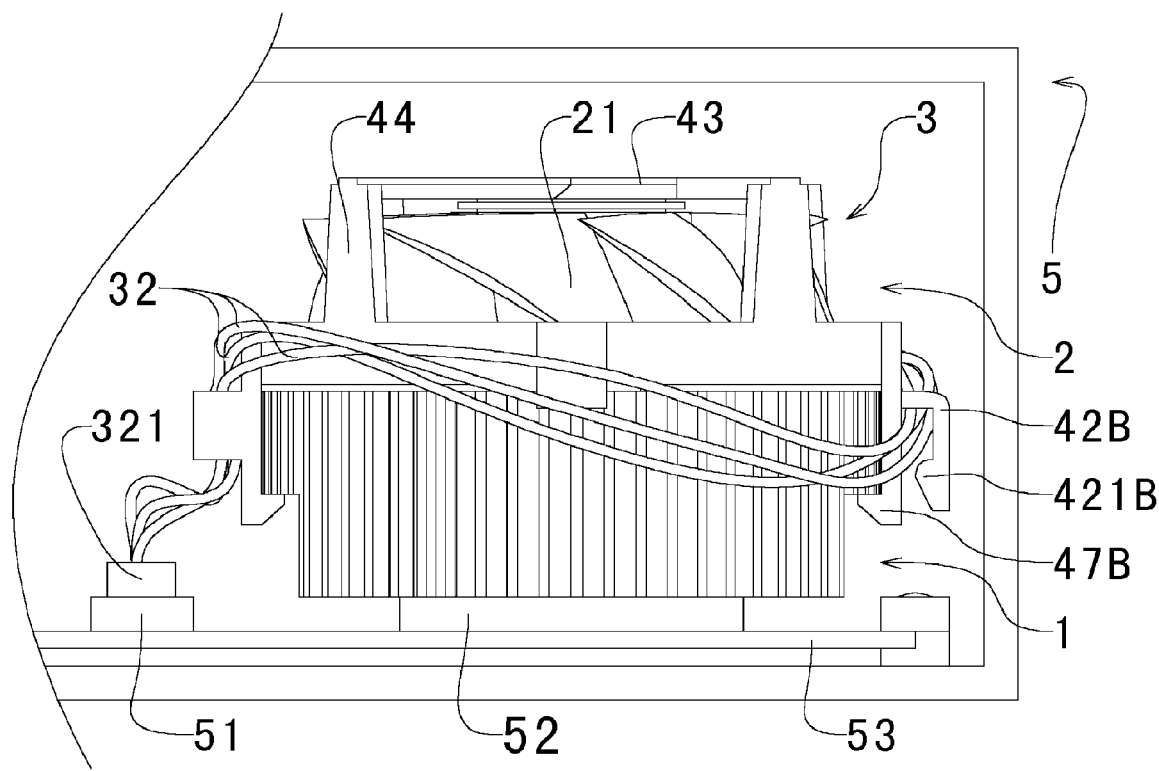
FIG. 4 is a side view of an embodiment in which a heat sink fan of the first embodiment of the invention is assembled into the component.

At that time, as shown in FIGS. 1 to 3, it is preferable that the lead wire 32 is held such that a side of the lead wire 32 held by the lead wire retaining hook 42A that is connected to the circuit substrate 33 comes above the retaining hook 42A, and a side of the lead wire 32 formed with the connection terminal 32a comes below the lead wire retaining hook 42A. With this configuration, as shown in FIG. 4, the lead wire 32 is held from an upper end of the lead wire retaining hook 42A toward a lower end thereof in the axial direction when the connection terminal 32a is connected to the power supply terminal 51 of the electronic equipment 5. With this, the retaining operability of the lead wire 32 is enhanced. Even if a force is abruptly applied to somewhere in the lead wire 32, it is possible to reduce possibilities that the lead wire is caught on the lead wire retaining hook 42A and the connection between the lead wire 32 and the circuit substrate 33 is cut off, connection failure is generated, and the lead wire 32 is damaged.

Figure 5:
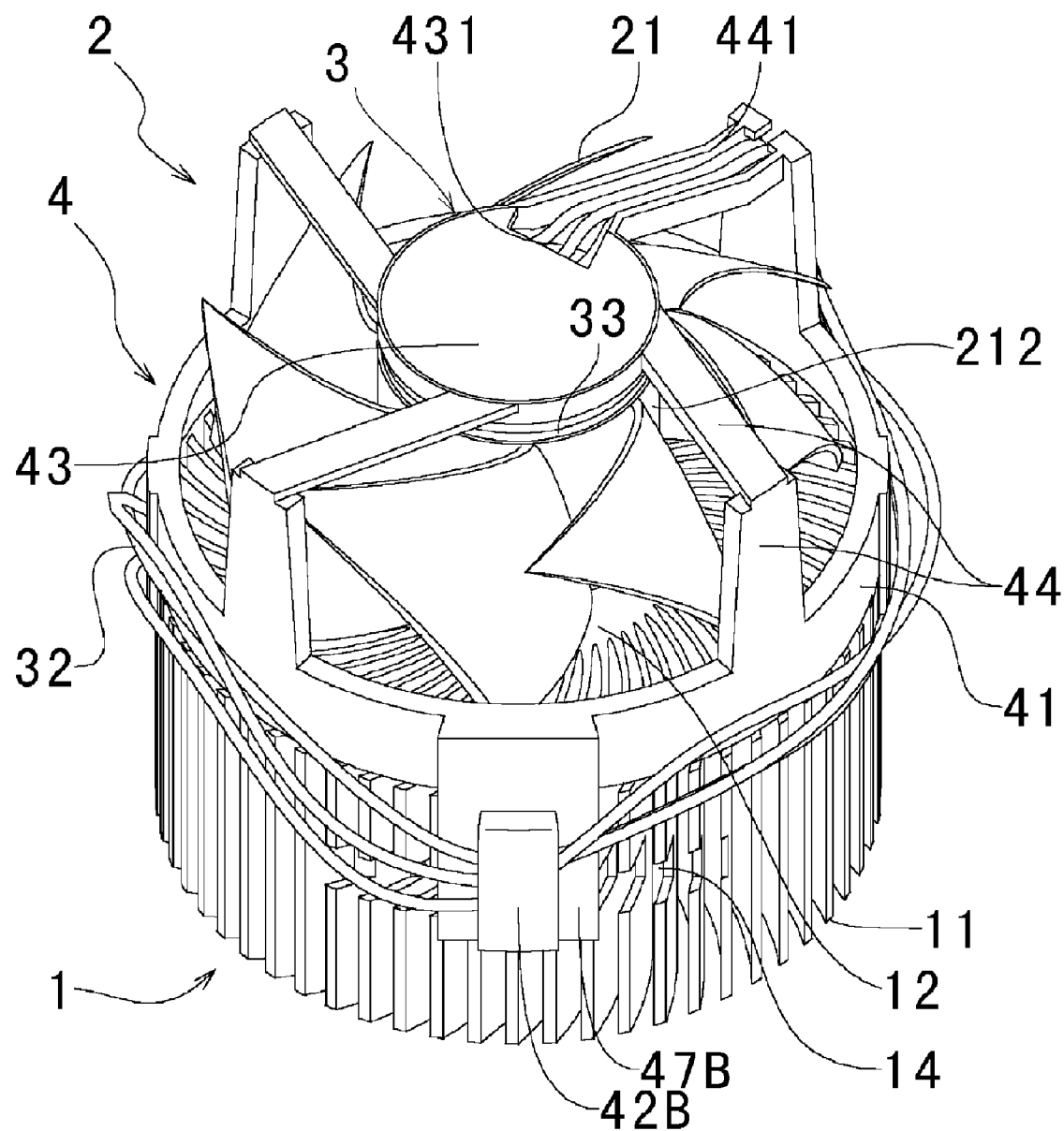
FIG. 5 is a perspective view of the first embodiment of the invention as viewed from different angle.
Figure 6:
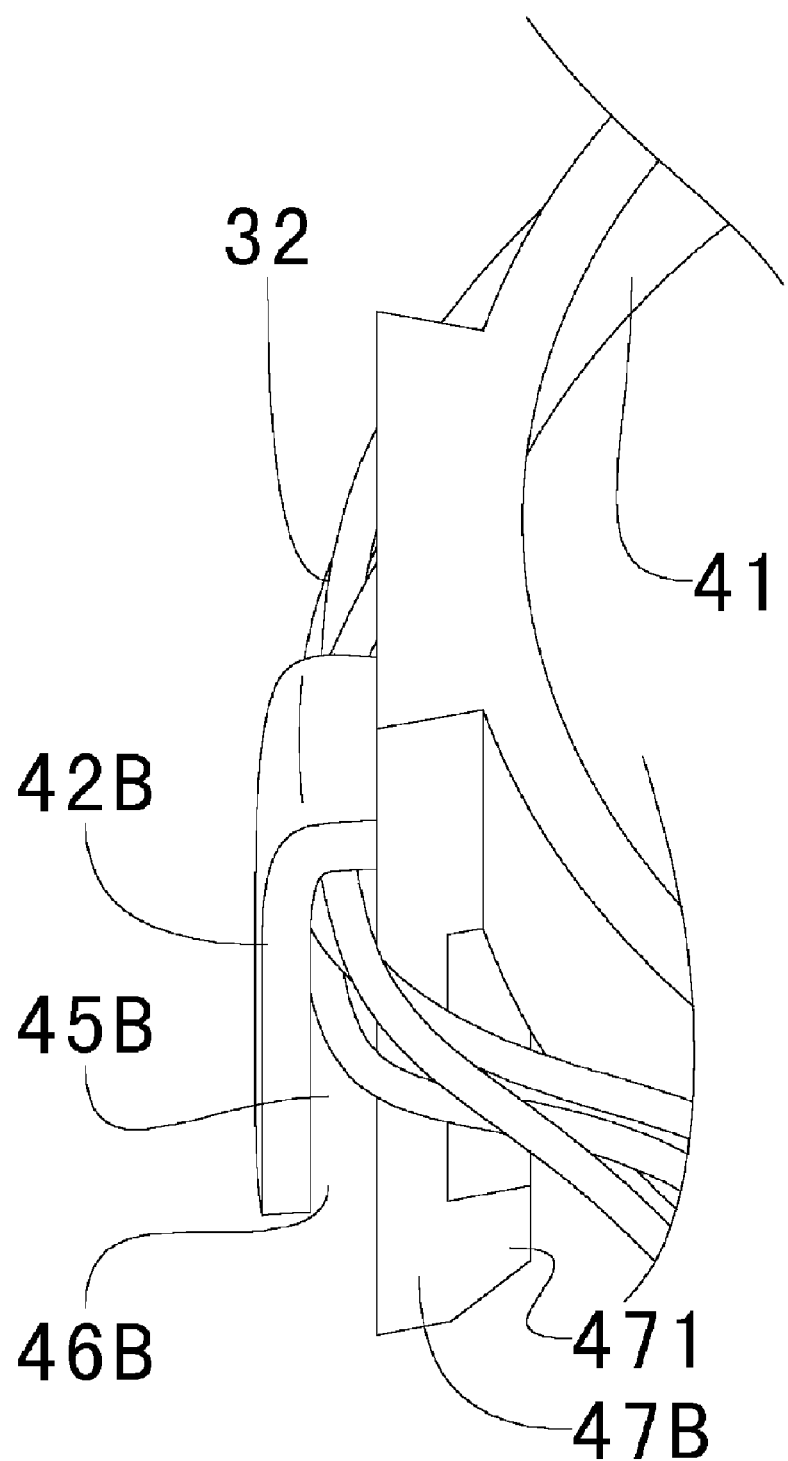
FIG. 6 is a perspective view showing an essential portion of the first embodiment of the invention.

FIG. 5 is a perspective view of the heat sink fan shown in FIG. 1 as viewed from another angle. FIG. 6 is an enlarged view of its essential portion. The lead wire retaining hook 42B projects from the arm 47B. A surface of the lead wire retaining hook 42B facing the rotation center of the impeller 21 and a surface of the arm 47B opposed to the former surface are substantially in parallel to each other, and those interspace distance between is constant.

Figure 7:
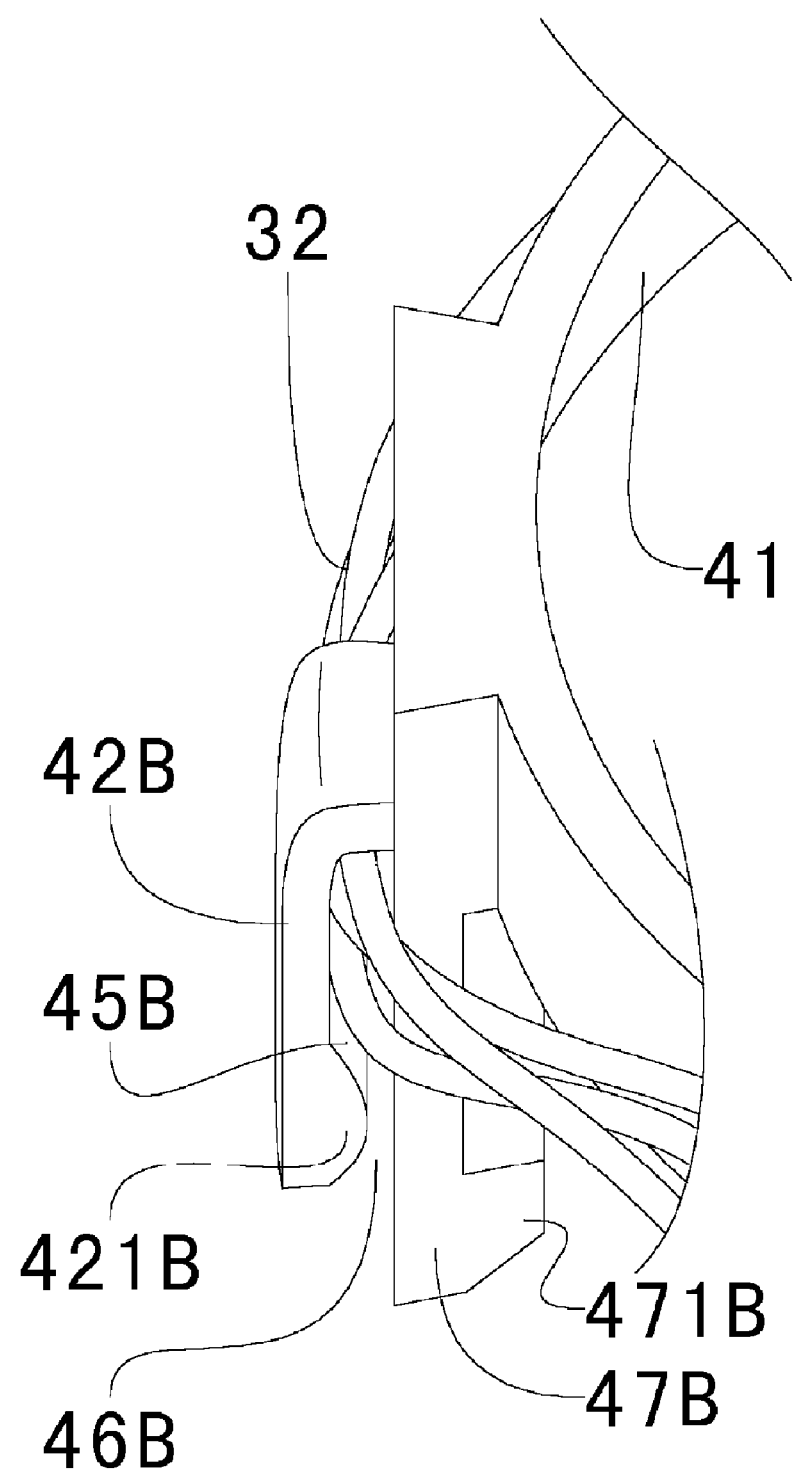
FIG. 7 is a perspective view showing an essential portion of the first embodiment of the invention.

FIG. 7 shows a modification of the lead wire retaining hook 42B shown in FIG. 6. The lead wire retaining hook 42B projects from the arm 47B. The lead wire retaining hook 42B is formed with a projection 421B which projects in the interspace 45B toward the arm 47B. This projection 421B can prevent the lead wire 32 from being naturally separated. The distance of the interspace 45B is increased toward the opened end, and the lead wire 32 can easily be inserted into the interspace 45B.

The lead wire retaining hook 42B is made of resin which is a material having elasticity. Even if the distance between the projection 421B and the arm 47B is smaller than the thickness of the lead wire 32, the lead wire retaining hook 42B is elastically deformed, and the lead wire 32 can easily be held in the interspace 45B.

Second Embodiment

Figure 8:
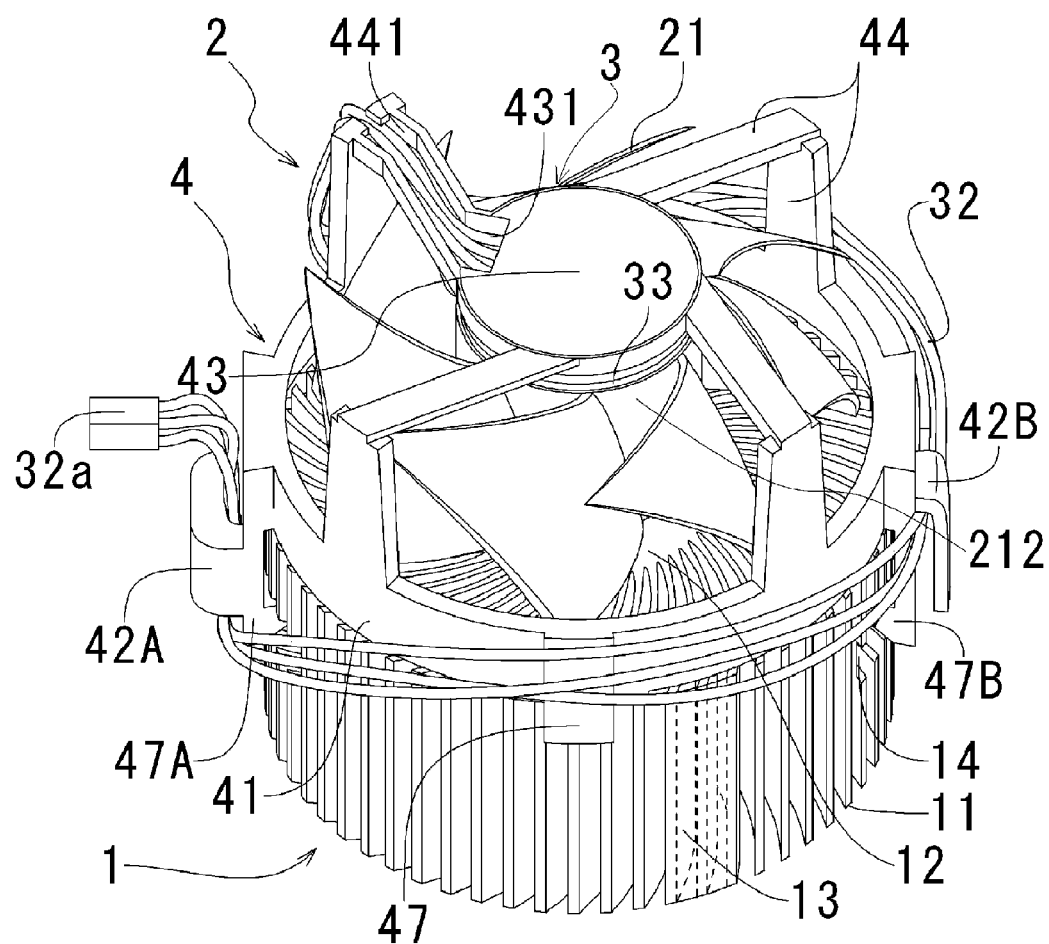
FIG. 8 is a perspective view showing a second embodiment of the invention.
Figure 9:
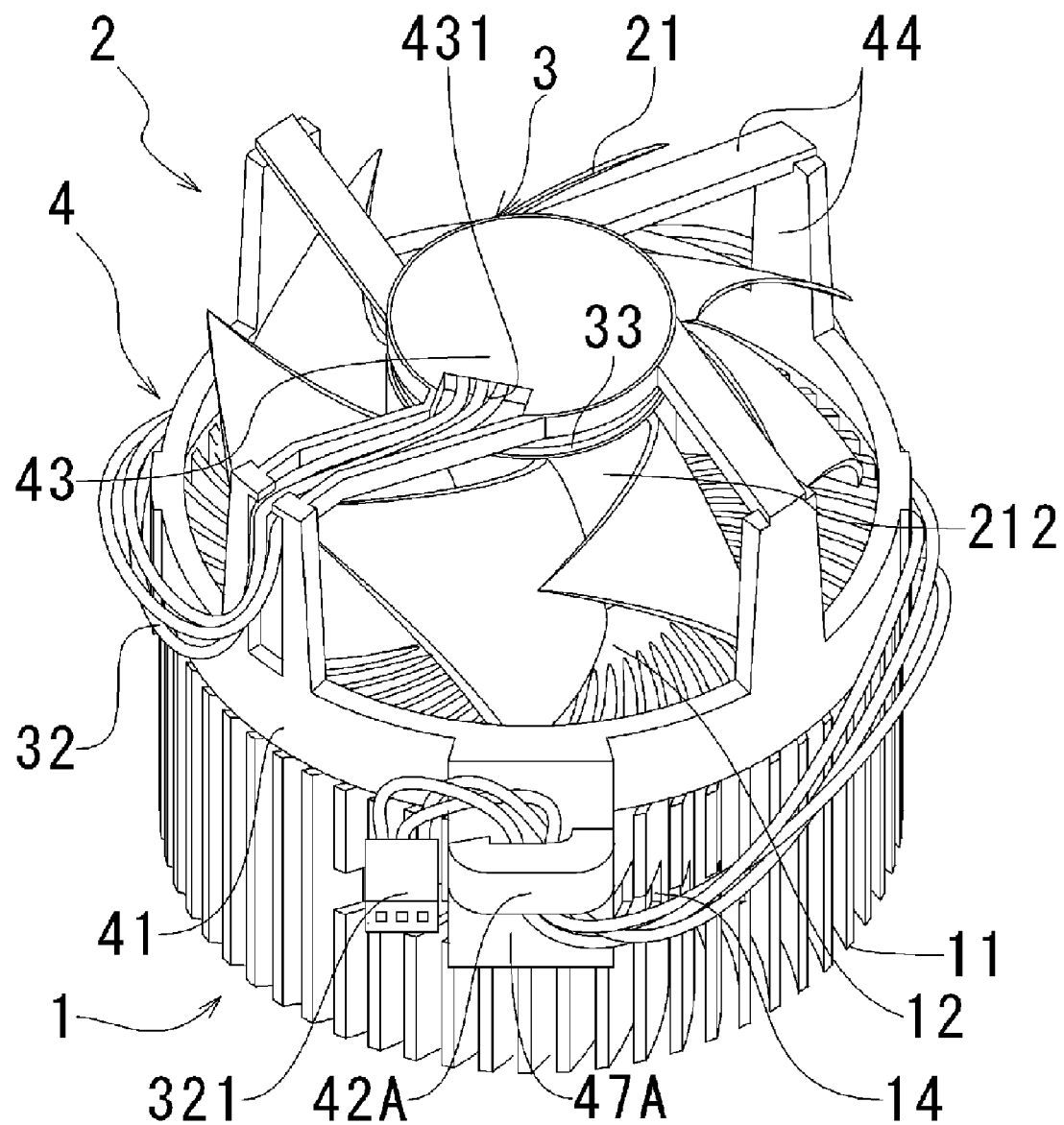
FIG. 9 is a perspective view of the second embodiment of the invention as viewed from different angle.
Figure 10:
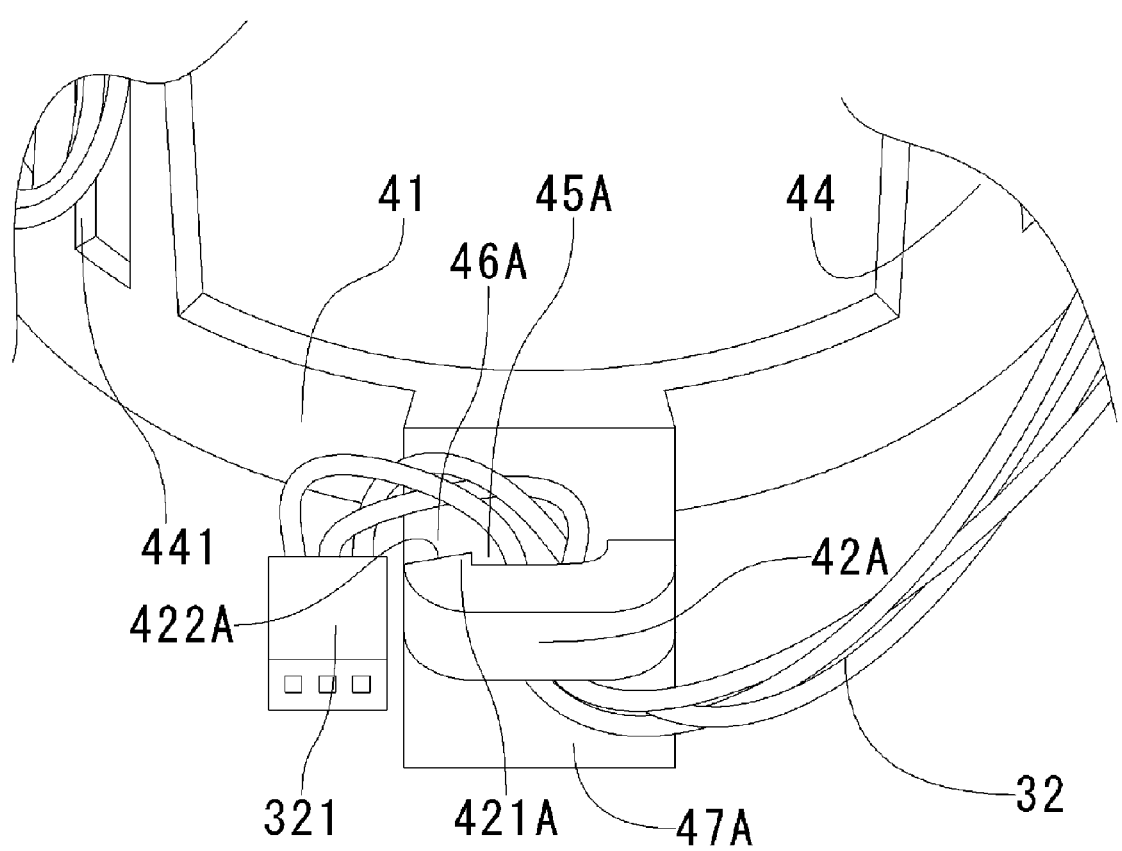
FIG. 10 is a perspective view showing an essential portion of the second embodiment of the invention.

FIG. 8 is a perspective view of an essential portion of a heat sink fan of a second embodiment of the invention. FIG. 9 is a perspective view of the heat sink fan shown in FIG. 8 as viewed from the arm 47A. FIG. 10 is an enlarged view of its essential portion.

(2-1) Constituent Elements

The heat sink fan of this embodiment has the same constituent elements as those of the heat sink fan of the first embodiment. Structures of the heat sink 1, the axial flow fan 2 and the motor 3 are also the same as those of the first embodiment.

(2-2) Retaining of Lead Wire

Like the first embodiment, the lead wires 32 are pulled out toward the outer periphery of the housing 4 through the guide groove 441 provided in one of the ribs 44 which support the motor holder 43 via the lead wire-pulling out hole 431.

If the pulled out lead wire 32 is inserted into the interspace 45 from the opening 46 of the interspace 45 of the lead wire retaining hook 42, the lead wire 32 can be held. When the lead wire 32 is to be detached, the lead wire 32 can be brought out from the interspace 45 via the opening 46. Since the lead wire 32 can be attached and detached easily, a burden of an operator at the time of mass production is reduced, and the operability can be enhanced. Further, a user does not erroneously carry out the attaching and detaching method, and the user can reliably attach and detach the lead wire 32.

Figure 11:
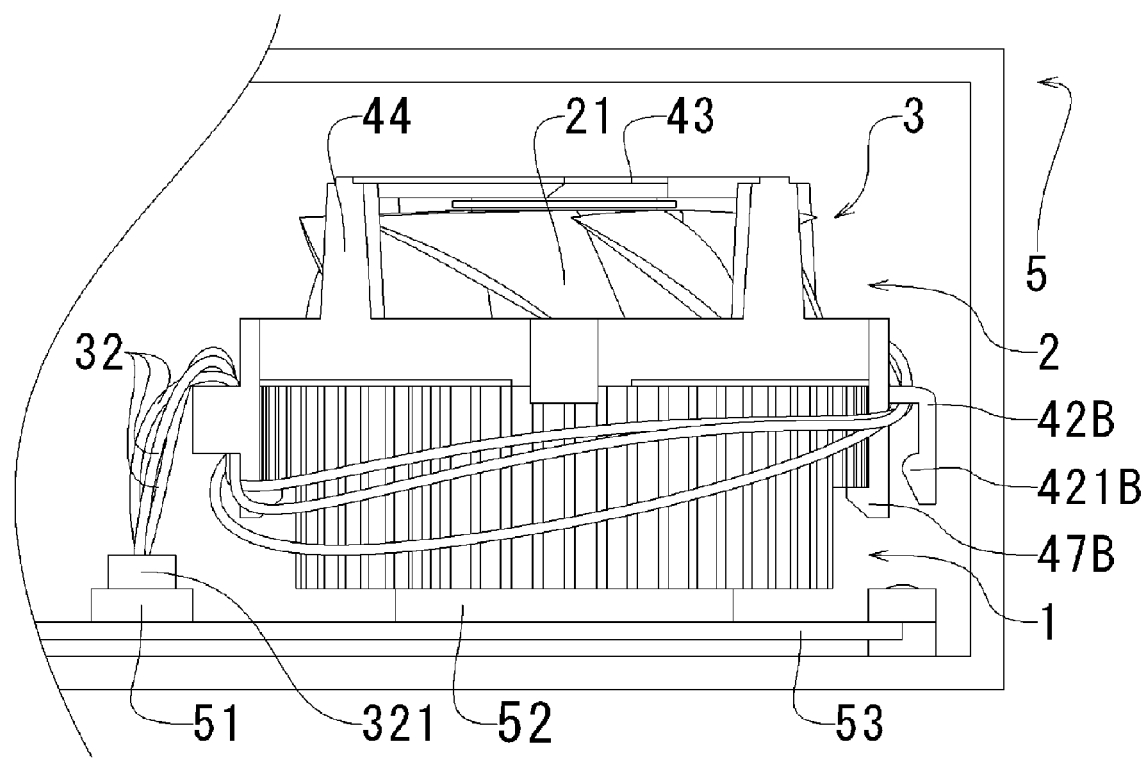
FIG. 11 is a side view of an embodiment in which a heat sink fan of the second embodiment of the invention is assembled into the component.

As shown in FIGS. 8 to 10, the second embodiment is different from the first embodiment in the retaining direction of the lead wires 32. The lead wires 32 are held such that a side of the lead wire 32 held by the lead wire retaining hook 42A which is formed with the connection terminal 32a comes above the lead wire retaining hook 42A, and a side of the lead wire 32 connected to the circuit substrate 33 comes below the retaining hook 42A. That is, the lead wires 32 are pulled out from the motor 3, guided along the outer peripheral surface of the cylindrical portion 41 of the housing 4, and passed from the heat sink 1 side (not shown) of the lead wire retaining hook 42A toward the motor 3, and the connection terminal 321 of the lead wire 32 is connected to the power supply terminal 51. With this configuration, the lead wire 32 extends along the heat sink 1 in the rotation axial direction of the cylindrical portion 41 of the housing 4. Thus, it is possible to prevent the lead wire 32 and the impeller 21 from interfering each other more reliably as compared with a case in which the lead wire is passed from a direction away from the impeller 21. With this configuration, as shown in FIG. 11, the lead wires 32 are held such that the lead wires are wound around the lead wire retaining hook 42A through about half when the connection terminal 32a is connected to the power supply terminal 51 of the electronic equipment 5. Then, even if a force is abruptly applied to somewhere in the lead wire 32, it is possible to reduce possibilities that the lead wire is caught on the lead wire retaining hook 42A and the connection between the lead wire 32 and the circuit substrate 33 is cut off, connection failure is generated, and the lead wire 32 is damaged.

Third Embodiment

Figure 12:
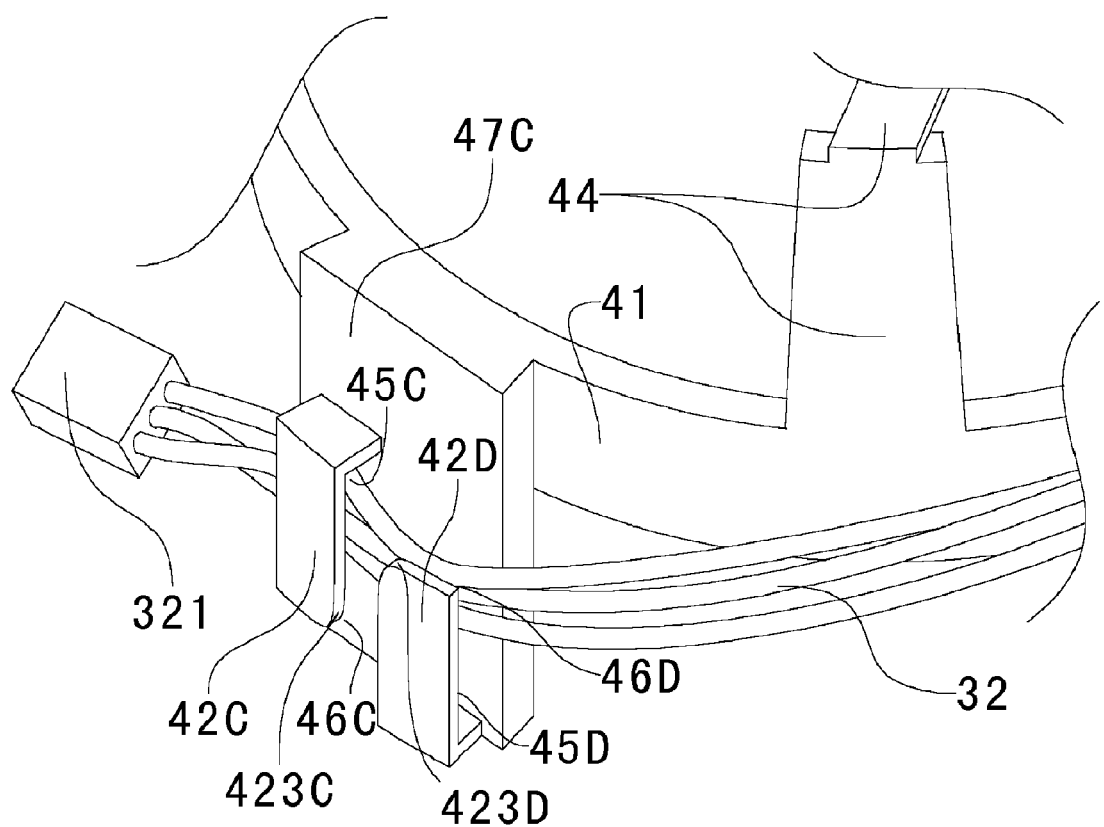
FIG. 12 is a perspective view showing an essential portion of a third embodiment of the invention.

FIG. 12 is a perspective view showing an essential portion of a heat sink fan of a third embodiment of the present invention.

(3-1) Constituent Elements

The heat sink fan of this embodiment has the same constituent elements as those of the heat sink fan of the first embodiment. Structures of the heat sink 1, the axial flow fan 2 and the motor 3 are also the same as those of the first embodiment.

(3-2) Retaining of Lead Wire

The cylindrical portion 41 of the housing 4 is formed with two arms 47B and 47C which are to be engaged with two heat sinks. The arms 47B and 47C are separated from each other through 180° in a circumferential direction of the cylindrical portion 41. The arm 47C is provided with two lead wire retaining hooks 42C and 42D. The lead wire retaining hooks 42C and 42D are adjacent in the circumferential direction. A interspace 45C is formed between the arm 47C and the lead wire retaining hooks 42C and 42D. An upper end of the lead wire retaining hook 42C is integrally fixed to the arm 47C, and a lower end of the lead wire retaining hook 42D is integrally formed with the arm 47C. Thus, the lower side of the lead wire retaining hook 42C is opened, and the upper side of the lead wire retaining hook 42D is opened.

To hold the lead wires in the two lead wire retaining hooks 42C and 42D, the lead wires are inserted into the lead wire retaining hook 42D from above, the lead wires 32 are allowed to enter the interspace 49 formed between the lead wire retaining hooks 42C and 42D, and the lead wires 32 are inserted into the lead wire retaining hook 42C from below.

With this, the lead wires 32 are held between the two lead wire retaining hooks and the arm 47C, and the lead wires are not easily separated naturally. If the lead wires 32 are held in this manner, lead wires 32 which were once held between the arm and the lead wire retaining hooks 42B and 42C can easily be separated again.

Opened edges 423C and 423D of the lead wire retaining hooks 42C and 42D are chamfered to remove angled portions. With this, it is possible to prevent the lead wires 32 from being caught on the angled portion and damaged during the holding operation of the lead wires 32 in the interspace 45C. Even if the lead wires 32 are held in the interspace 45D and are not held in the interspace 45C and are used as they are, the lead wires are not easily be damaged.

The width of the interspace 45C formed between the arm 47C and the lead wire retaining hooks 42C and 42D is smaller than the smallest width of the connection terminal 321 mounted on the tip end of the lead wire 32. With this, it is possible to prevent the lead wire from being naturally separated after the lead wire is once held in the lead wire retaining hook.

The other arm 47B and the lead wire retaining hook 42B formed on the arms 47B is the same as the arm 47B and the lead wire retaining hook 42B of the first embodiment.

In this embodiment, one of the arms 47B and 47C is formed with the two lead wire retaining hooks 42C and 42D, and the other arm is formed with the one lead wire retaining hook 42B. Alternatively, both the arms may be formed with the lead wire retaining hooks 42 two each. The explanation of the lead wire retaining hook 42 is based on the example shown in FIG. 12, but the vertical direction of the axial direction in which the interspace formed between the lead wire retaining hook 42 and the arm 47 is not limited to the invention of the embodiment.

The lead wire retaining hooks 42C and 42D of the embodiment may have the projections 421 shown in FIG. 7. It is preferable that an opened end of the projection is formed with a tapered portion 422.

Other Embodiments

Although the embodiments of the heat sink fan of the present invention have been explained above, the invention is not limited to the embodiments, and various modification and changes of the embodiment can be made without departing from the scope of patent claims.

For example, the heat sink 1 of the invention need not be of cylindrical shape as a whole, and may be of square pole shape on which heat radiating fins 11 arranged in one direction, or a portion of an outer peripheral surface of a cylindrical heat sink 1 may be cut to form a flat surface, or the heat sink 1 may be of polygonal pole, or the radiating fin 11 may be mounted on a base of the heat sink 1 as a separate fin. Alternatively, the radiating fin may be a skive fin formed by cut and rise the radiating fin 11 from a substrate, a corrugate fin formed by bending one sheet of metal plate, of the radiating fin may be formed by extruding metal from die, or the radiating fin may be formed by die casting.

Figure 13:
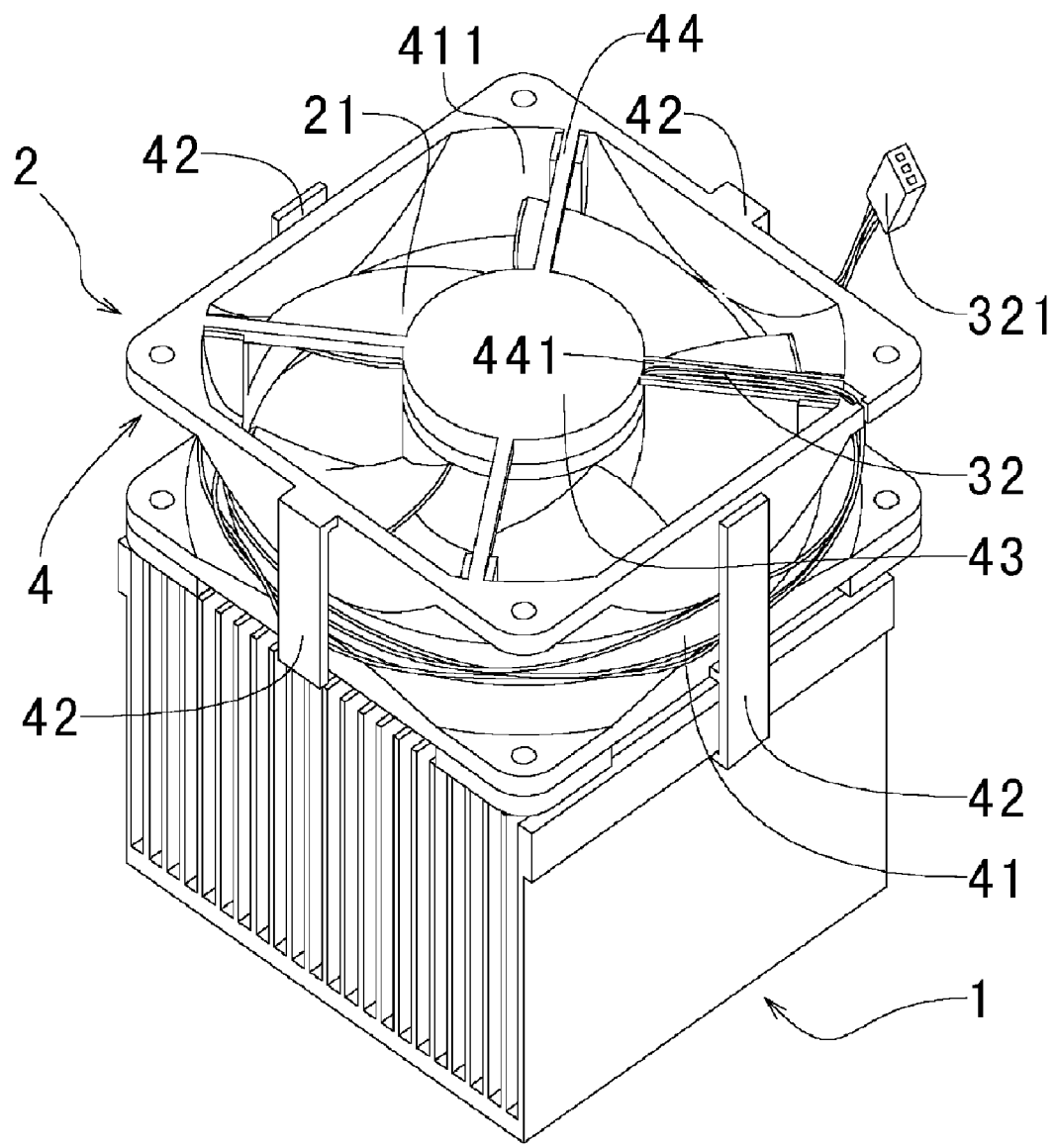
FIG. 13 is a perspective view showing an essential portion of another embodiment of the invention.

As shown in FIG. 13, the shape of the housing 4 of the axial flow fan 2 may be square having an end plate 48 of right angle on each of both ends of the impeller 21 in the rotation axial direction. The housing 4 may have an inclined opening 411 in which a suction port area and a discharge port area of the cylindrical portion 41 are widened toward the opening. The outer wall surface of the cylindrical portion 41 need not be of cylindrical shape. In this case, one of outer wall surfaces of the cylindrical portion 41 is provided with the lead wire retaining hook 42.

The motor holder 43 may be disposed on an end of the cylindrical portion 41 closer to the heat sink 1. The axial flow fan 2 may directly be fixed to the equipment 5 in addition to the heat sink 1. When the axial flow fan 2 supplies wind to the heat sink 1, the wind may be supplied in a blowing direction of wind into the heat sink 1 or in a suction direction of wind from the heat sink 1.

The axial flow fan 2 may not be disposed on the upper surface 12 of the heat sink 1 and the axial flow fan 2 may be disposed on the side surface of the heat sink 1. In this case, when the heat sink 1 is of polygonal pole shape, a plurality of axial flow fans 2 may be disposed on a sidewall thereof. In this case, it is expected that the number of lead wires 32 is greater than that of the axial flow fans, and it is possible to prevent the handling operation of the lead wire 32 from being complicated by the lead wire retaining hook 42.

The lead wire 32 and the circuit substrate 33 may be connected to each other through a pin or a connector.

The arms are disposed on two locations in this embodiment, but the arms may be disposed on three or more locations or one location. It is not necessary to form the lead wire retaining hooks 42 on all of the arms. The shape of the lead wire retaining hook is not limited to the plate-like shape, a rod may be bent, or a bent wire or metal plate may integrally be formed by insert forming. In this case, plastic deformation of plural times is possible, it is not always necessary to form them integrally, and they may be fixed by adhesive, welding or fitting.

The heat sink fan of the present invention exhibits the following effects.

The heat sink fan of the invention supplies cooling air to the heat sink by the axial flow fan. The axial flow fan includes an impeller, a motor for rotating the impeller, and a housing for supporting the motor. The motor includes a drive unit for rotating the impeller, and a lead wire for supplying current to the drive unit. The housing includes a cylindrical portion disposed on an outer periphery of the impeller. The lead wire retaining hook for holding the lead wire projects from an outer wall surface of the cylindrical portion. The lead wire retaining hook mounted on the outer wall surface of the cylindrical portion is opposed to the outer wall surface, and the lead wire of the motor is inserted through a space between the line or surface and the outer wall surface. With this, the free movement of the lead wire is limited.

With this, it is possible to prevent entanglement of the lead wire, and prevent the lead wire from interfering with other electronic component and from being cut. It is also possible to prevent the lead wire from being caught on a resin product and being cracked. It is also possible to prevent a case in which an operator is caught on a projected lead wire to strongly pull the lead wire, and contact between the lead wire and a circuit substrate of the motor is deteriorated. Since it becomes easy to handle the lead wire, it is possible to prevent the packing operation or transportation from being complicated. The lead wire retaining hook is mounted on the cylindrical portion, and the lead wire retaining hook can be formed integrally on the cylindrical portion. Thus, the lead wire retaining hook can be produced without increasing the producing cost almost at all.

In the heat sink fan of the present invention, the shape of the lead wire retaining hook includes a closed portion projecting from an outer wall surface, and an inner surface which is opposed to the outer wall surface and substantially in parallel thereto, and a interspace is formed between the inner surface and the outer wall surface. The interspace is opened at an end of the lead wire retaining hook which is different from the closed portion.

The interspace is formed between the outer wall surface and the inner surface of the lead wire along the outer wall surface. Thus, it is easy to accommodate the lead wire in the interspace along the outer wall surface. The lead wire can be held in the interspace from the open portion of the interspace, and the lead wire can easily be accommodated in the interspace.

According to the heat sink fan of the invention, the projection provided on the arm extended from the cylindrical portion of the housing of the axial flow fan toward the heat sink engages the recess provided in the heat sink, and the projection is positioned and/or fixed. The arm is provided with the lead wire retaining hook.

With this, a force is applied to the arm when great pressure or tensile force is applied to the lead wire retaining hook, and it is possible to prevent the cylindrical portion from being damaged. Even if the length of the cylindrical portion in the rotation axial direction of the impeller is short, it is possible to dispose the lead wire retaining hook on the outer wall surface of the cylindrical portion, and the layout flexibility of the lead wire retaining hook can be enhanced.

The lead wire retaining hook of the heat sink fan of the invention detachably holds the lead wire.

Thus, when it is assembled to the equipment, if the length of the lead wire is excessively long or short, it is necessary to adjust the length of the lead wire in accordance with the distance from the heat sink fan to the power supply terminal. If the lead wire is detachably held by the lead wire retaining hook, the lead wire can be detached from the lead wire retaining hook and used if necessary.

Two or more lead wire retaining hooks are provided on the outer wall surface of the heat sink fan of the invention, the lead wire retaining hooks are disposed at interspaces in the circumferential direction, and at least one of the interspaces is opened in a direction different from that of the other interspace.

With this configuration, the operability of holding the lead wire in the interspace between the lead wire retaining hook and the cylindrical portion is not deteriorated, and even if the lead wire is pulled into any direction, it is possible to prevent the lead wire from being come out easily.

According to the heat sink fan of the present invention, two lead wire retaining hooks are disposed adjacent to each other on one arm, one of the lead wire retaining hooks is opened toward one end of the impeller in the axial direction, and the other lead wire retaining hook is opened toward the other end of the impeller in the axial direction.

The axial movement is limited within a given range at one location, the lead wire can easily be inserted, and it is possible to prevent the lead wire from being naturally separated.

According to the heat sink fan of the present invention, a distance between the two lead wire retaining hooks disposed adjacent to each other on the one arm is a predetermined interspace.

With this configuration, one of the lead wire retaining hooks can easily hold the lead wire while the other lead wire retaining hook hold the lead wire.

The lead wire retaining hook of the heat sink fan of the present invention is provided at the outer periphery in the radial direction and/or outer side in the rotation axial direction of the impeller than the rotation region of the impeller.

Thus, it is possible to prevent the lead wire from interfering with the impeller and from being cut. It is possible to avoid a case that the lead wire is caught on the impeller to damage the impeller.

According to the heat sink fan of the present invention, the interspace between the lead wire retaining hook and the outer wall surface is formed with a narrow portion in which the interspace is narrowed.

Thus, if the lead wire is once held in the interspace, it is possible to prevent the lead wire from naturally coming off.

According to the heat sink fan of the present invention, the lead wire retaining hook is made of elastic member.

Thus, even if the width of the narrow portion is narrower than the thickness of the lead wire, the lead wire can be held in the interspace, and the lead wire is less prone to come off naturally.

According to the heat sink fan of the present invention, the lead wire retaining hook is formed with a tapered portion which is gradually increased in size in the opening direction of the interspace.

Thus, the lead wire can easily be held by the lead wire retaining hook, it is possible to prevent the lead wire from coming off naturally.

The heat sink fan of the present invention includes a connection terminal capable of connecting the one end of the lead wire to the drive unit and connecting the other end to the power supply terminal. With this power supply terminal, equipment can easily be connected to the power supply, and the operability is also enhanced. At least one of the lead wire retaining hooks is provided at its one end with a closed portion radially projecting from the outer wall surface, and an inner surface which is opposed to the outer wall surface and which is substantially in parallel to the outer wall surface. The interspace is formed between the inner surface and the outer wall surface, and the other end of the lead wire retaining hook is opened. The lead wire is inserted, from the drive unit of the motor, into one end of the impeller in the rotation axial direction on which the heat sink is mounted, and into the other end of the impeller in the rotation axial direction on which the motor is mounted, and the lead wire can be connected to the power supply terminal.

With this, the lead wire is inserted from a direction away from the impeller, and the possibility that the impeller and the lead wire interfere with each other can be reduced. It is possible to prevent the lead wire from interfering with other electronic component in the electronic equipment, and the lead wire can easily be held by the lead wire retaining hook at the time of production.

Although the present invention has been fully described by way of example with reference to the accompanying drawings, it is to be understood that various changes and, modifications will be apparent to those skilled in the art. Therefore, unless otherwise such changes and modifications depart from the scope of the present invention hereinafter defined, they should be construed as being included therein.

What is claimed is:

1. A heat sink fan for cooling an electronic component, the heat sink fan comprising:
    a heat sink including a plurality of fins;
    a drive unit including a motor and a lead wire for supplying an electric current to the motor;
    an impeller driven by the drive unit for supplying air to the heat sink;
    a housing for supporting the drive unit and having therein a cylindrical portion for containing therein at least a portion of the impeller; and
    a lead wire retaining hook arranged on an outer wall surface of the cylindrical portion, extending along the outer wall surface of the cylindrical portion, wherein an interspace is generated between the outer wall surface of the cylindrical portion and the lead wire retaining hook so as to retain therein the lead wire.

2. The heat sink fan according to claim 1, wherein the lead wire retaining hook includes:
    at one end thereof, a closed portion projecting from the outer wall surface of the cylindrical portion; and
    an inner surface opposing to the outer wall surface, and an interspace is provided between the inner surface and the outer wall surface, and
    an end of the lead wire retaining hook opposite from the closed portion is an open portion.

3. The heat sink fan according to claim 1, wherein the heat sink includes a heat-absorbing surface abutting the electronic component, and includes a heat-dissipating surface opposing to an opening of the cylindrical portion of the housing,
    at least two arms each are integrally formed with cylindrical portion at the outer wall surface, the arms each extend from the cylindrical portion toward the heat sink,
    the arms determine a position of the housing with respect to the heat sink, and
    the lead wire retaining hook is formed on at least one of the arms.

4. The heat sink fan according to claim 1, wherein the lead wire is detachably retained by the lead wire retaining hook.

5. The heat sink fan according to claim 2 further comprising at least two of the lead wire retaining hooks, wherein
    the at least two lead wire retaining hooks having a predetermined distance therebetween in a circumferential direction are provided, and
    a direction to which the interspace of at least one of the two lead wire retaining hooks is open is different from that of another interspace of another lead wire retaining hook.

6. The heat sink fan according to claim 3, wherein
    at least one arm on the outer wall surface has formed thereon two of the lead wire retaining hooks adjacent to one another,
    the closed portion of one of the two lead wire retaining hooks is, with respect to the opposite end of said lead wire retaining hook, arranged in a circumferential direction, and the closed portion of another of the two lead wire retaining hooks is, with respect to the opposite end of said lead wire retaining hook, arranged in an axial direction.

7. The heat sink fan according to claim 6, wherein the two of the lead wire retaining hooks are arranged having a predetermined distance therebetween.

8. The heat sink fan according to claim 1, wherein
    the lead wire retaining hook is arranged outwardly from a rotation region of the impeller in at least one of a radial direction and an axial direction, and
    the rotation region of the impeller is a smallest space in which the impeller rotates.

9. The heat sink fan according to claim 2, wherein at least one of the inner surface of the lead wire retaining hook and the outer wall surface projects in the radial direction so as to form a narrow portion at which the interspace is narrowed.

10. The heat sink fan according to claim 1, wherein the lead wire retaining hook is made of elastic member.

11. The heat sink fan according to claim 2, wherein the interspace formed between the outer wall surface and the inner surface of the lead wire retaining hook is formed with a tapered portion, at which a distance between the outer wall surface and the inner surface of the lead wire retaining hook gradually increases toward the open portion.

12. The heat sink fan according to claim 1, wherein
the lead wire is connected to the drive unit at one end of the lead wire and has at the other end thereof a connection terminal capable of connecting to a power supply terminal,
at least one of the lead wire retaining hooks has a closed portion projecting from the outer wall surface, and an inner surface substantially parallel to the outer wall surface, wherein an interspace is formed between the outer wall surface and the inner surface, an end of the lead wire retaining hook opposite from the closed portion is an open portion,
the lead wire is connected to the power supply terminal via the interspace from one side in the axial direction of the interspace where the heat sink is located to another side of the interspace where the motor is located.

* * * * *